(12) United States Patent
Hashemi et al.

(10) Patent No.: US 10,546,928 B2
(45) Date of Patent: Jan. 28, 2020

(54) FORMING STACKED TWIN III-V NANO-SHEETS USING ASPECT-RATIO TRAPPING TECHNIQUES

(71) Applicant: International Business Machines Corporation, Armonk, NY (US)

(72) Inventors: Pouya Hashemi, White Plains, NY (US); Karthik Balakrishnan, White Plains, NY (US); Alexander Reznicek, Troy, NY (US); Mahmoud Khojasteh, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 24 days.

(21) Appl. No.: 15/834,721

(22) Filed: Dec. 7, 2017

(65) Prior Publication Data

US 2019/0181228 A1    Jun. 13, 2019

(51) Int. Cl.
| | | |
|---|---|---|
| H01L 33/00 | (2010.01) | |
| H01L 29/10 | (2006.01) | |
| H01L 29/06 | (2006.01) | |
| H01L 29/207 | (2006.01) | |
| H01L 29/34 | (2006.01) | |
| H01L 29/04 | (2006.01) | |
| H01L 21/02 | (2006.01) | |
| H01L 29/786 | (2006.01) | |
| H01L 29/66 | (2006.01) | |
| H01L 21/306 | (2006.01) | |

(52) U.S. Cl.
CPC ...... *H01L 29/1083* (2013.01); *H01L 21/0259* (2013.01); *H01L 21/02543* (2013.01); *H01L 21/02546* (2013.01); *H01L 21/30612* (2013.01); *H01L 21/30625* (2013.01); *H01L 29/045* (2013.01); *H01L 29/0665* (2013.01); *H01L 29/207* (2013.01); *H01L 29/34* (2013.01); *H01L 29/6653* (2013.01); *H01L 29/66522* (2013.01); *H01L 29/78681* (2013.01)

(58) Field of Classification Search
CPC ............. H01L 29/785; H01L 29/66553; H01L 29/6656; H01L 29/66795; H01L 29/0665; H01L 29/41791; H01L 21/823431; H01L 21/02532; H01L 21/02057; H01L 21/0262; H01L 21/02381; H01L 29/161; H01L 29/03
See application file for complete search history.

(56) References Cited

U.S. PATENT DOCUMENTS

| | | | |
|---|---|---|---|
| 6,885,055 B2 | 4/2005 | Lee | |
| 8,106,459 B2 | 1/2012 | Chang et al. | |
| 8,263,462 B2 | 9/2012 | Hung et al. | |
| 8,502,263 B2* | 8/2013 | Li | H01L 21/02381 257/103 |
| 9,761,722 B1* | 9/2017 | Jagannathan | H01L 29/785 |
| 9,837,414 B1* | 12/2017 | Balakrishnan | H01L 29/1083 |
| 10,109,533 B1* | 10/2018 | Xie | H01L 21/82382 |
| 2010/0072515 A1* | 3/2010 | Park | H01L 21/02494 257/190 |

(Continued)

*Primary Examiner* — Roy K Potter
(74) *Attorney, Agent, or Firm* — Patterson + Sheridan, LLP

(57) ABSTRACT

A semiconductor structure that includes: a substrate, a twin vertical punch-through stopper layer structure connected to the substrate, and a plurality of nanosheets connected to and supported by the twin vertical punch-through stopper structure and isolated from the substrate by an insulating dielectric.

20 Claims, 12 Drawing Sheets

(56) References Cited

U.S. PATENT DOCUMENTS

2011/0049568 A1    3/2011   Lochtefeld et al.
2015/0014700 A1*   1/2015   Khalil ................ H01L 29/7788
                                                          257/76
2016/0104765 A1*   4/2016   Ching ............. H01L 21/823431
                                                          257/29
2016/0163731 A1*   6/2016   Tan .................... H01L 29/0638
                                                          257/324

* cited by examiner

FORMING STACKED TWIN III-V NANO-SHEETS USING ASPECT-RATIO TRAPPING TECHNIQUES

BACKGROUND

A. Field of the Invention

The present application relates to semiconductor technology. More particularly, the present application relates to a semiconductor structure including stacked semiconductor nanosheets and a method of forming the same.

B. Related Art

The use of non-planar semiconductor devices such as, for example, fin field effect transistors (FinFETs) is the next step in the evolution of complementary metal oxide semiconductor (CMOS) devices. Fin field effect transistors (FinFETs) can achieve better device electrostatics with increasingly smaller dimensions as compared to conventional planar FETs. As technology progresses, further improvements over conventional FinFETs are required.

SUMMARY

According to one aspect of the present specification, a semiconductor structure is provided. The semiconductor structure includes: a substrate, at least two twin vertical punch-through stopper layers connected to the substrate, and a plurality of nanosheets connected to and supported by the twin vertical punch-through stopper layers and isolated from the substrate by an insulating dielectric.

According to another aspect of the present specification, a method for forming a semiconductor device is provided. The method includes the steps of: providing a semiconductor substrate, providing a dielectric material layer suitable as a dislocation blocking mask in an aspect-ratio process on the semiconductor substrate, forming an aspect-ratio trench on the semiconductor substrate, depositing a punch-through stop layer (PTS) layer over the substrate, and developing a plurality of nanosheets from the formed aspect-ratio trapping trench, where the plurality of nanosheets contact and are supported by the PTS layer.

According to another aspect of the present specification, a semiconductor structure is provided. The structure includes: a substrate, at least two twin vertical punch-through stop layer (PTS) layers connected to the substrate, and a plurality of nanosheets connected to and supported by the twin vertical PTS layers, wherein a portion of the plurality of nanosheets extend horizontally from one of the at least two twin vertical PTS layers towards another one of the at least two twin vertical PTS layers, wherein another portion of the plurality of PTS layers extends horizontally from the another one of the at least two twin vertical punch layer towards the one of the at least two twin vertical PTS layers, and wherein a gap extends between the portion of the plurality of nanosheets and the another portion of the plurality of nanosheets.

DETAILED DESCRIPTION

Figure 1:
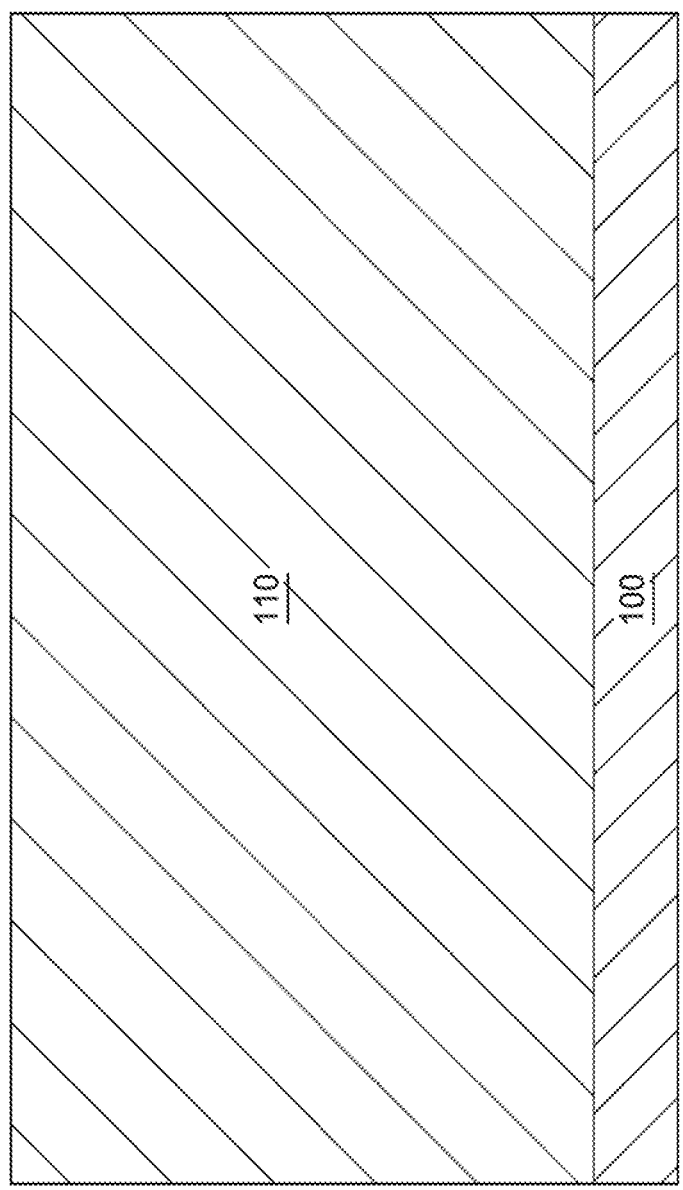
FIGS. 1 and 2 show a semiconductor substrate and provisioned dielectric material that is suitable for use in an aspect-ratio trapping process in accordance with an embodiment of the present specification.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

The present application provides a semiconductor structure that can be used for fabricating non-planar semiconductor devices that have improved electrostatic characteristics and increased device width per footprint area as compared with conventional FinFET devices. For example, according to one embodiment of the present specification, a novel structure, and method of making the same, is provided, where the structure includes a semiconductor substrate overlaid with a p-doped punch-through stop (PTS) layer that connects to and supports a plurality of nanosheets. In another embodiment, the plurality of nanosheets and the PTS layer are made using III-V materials. The III-V materials can be, by way of non-limiting examples, be selected from the group of gallium arsenide (GaAs), indium phosphide (InP) and indium gallium arsenide (InGaAs). In yet another embodiment, a dislocation barrier layer of silicon nitride material and deposited III-V semiconductor material, which can also be made with materials from the group of gallium arsenide (GaAs), indium phosphide (InP) and indium gallium arsenide (InGaAs), are used, in accordance with aspect-ratio trapping techniques, to form, and are included in, the novel structure. In such an embodiment, the deposited III-V semiconductor can form a 111 interface with an aspect-ratio trapping trench in the substrate, and the novel structure is made using aspect-ratio trapping techniques.

Figure 2:
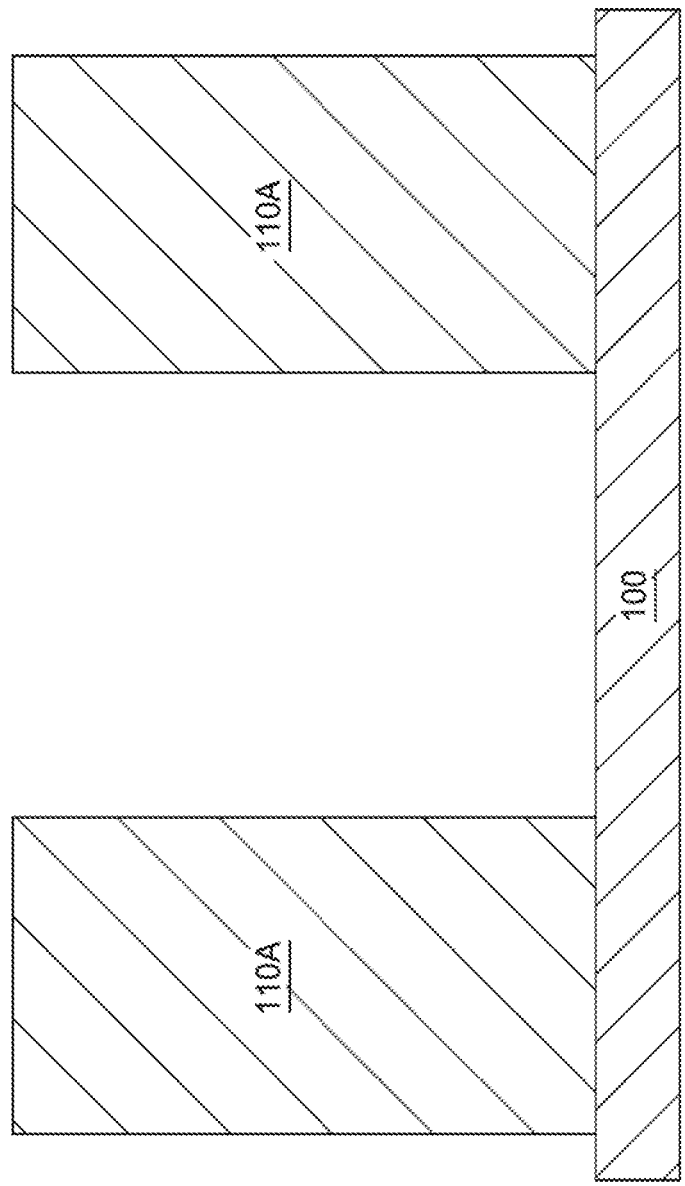

FIGS. 1 and 2 illustrate a dielectric layer 110 in contact with a semiconductor substrate 100. The semiconductor substrate 100 may be composed of a silicon containing material such as Si, single crystal Si, polycrystalline Si, SiGe, single crystal silicon germanium, and combinations and multi-layers thereof. The semiconductor substrate 100 may also be composed of other semiconductor materials, such as germanium, and compound semiconductor substrates, such as type III/V (III-V) semiconductor substrates, e.g., gallium arsenide (GaAs). Although the semiconductor substrate 100 is depicted as a bulk semiconductor substrate, semiconductor on insulator (SOI) substrate arrangements, such as silicon on insulator substrates, are also suitable for the semiconductor substrate 100.

The dielectric layer 110 may be composed of an oxide, nitride or oxynitride material. In one embodiment of the present specification, the first dielectric layer 110 is composed of silicon oxide ($SiO_2$). In other embodiments, the dielectric layer 110 is composed of silicon nitride or silicon oxynitride. It is noted that the above examples of dielectric materials for the dielectric layer 110 are provided for illustrative purposes only, and are not intended to limit the present disclosure, as other dielectric materials may also be employed for the dielectric layer 110. The dielectric layer 110 may be formed using any deposition or thermal growth process. If dielectric layer 110 is composed of silicon oxide ($SiO_2$), the dielectric layer 110 may be formed using thermal oxidation. In other examples, the dielectric layer 110 may be formed using a deposition process, such as chemical vapor deposition (CVD) or variations thereof such as Atmospheric Pressure CVD (APCVD), Low Pressure CVD (LPCVD) and Plasma Enhanced CVD (PECVD), Metal-Organic CVD (MOCVD) and combinations thereof may also be employed. The dielectric layer 110 may also be deposited using evaporation, chemical solution deposition, spin on deposition, and physical vapor deposition (PVD) methods.

The dielectric layer 110 can be patterned or otherwise altered to form a dislocation barrier layer 110A or dislocation blocking layer 110A that is suitable in an aspect-ratio trapping process, which, by way of non-limiting example, with respect to both the development of the dislocation barrier layer 110A and aspect-ratio trapping techniques in general, is discussed in U.S. Patent Application Publication No. 2011/0049568 to Lochtefeld et al. ("Lochtefeld"), the entire content of which is incorporated herein by reference, and is subsequently referred to herein. In a general sense, aspect-ratio trapping processes refer to practices and techniques for confining defects, such as dislocation defects, that arise as a result of lattice-mismatches between material grown on a particular surface and the surface on which the growth takes place; (for example, due to lattice-constant mismatches between the deposited material and the surface material).

The patterning of the dislocation barrier layer 110A can be performed by lithography and etching. Lithography can include forming a photoresist material above the dislocation barrier layer 110A, exposing the photoresist material to a desired pattern of radiation, and developing the photoresist utilizing a conventional photoresist developer. After the photoresist material has been patterned, the pattern provided to the photoresist material can be transferred to the underlying dislocation barrier layer 110A by etching. The etch used for pattern transfer may be a dry etching process such as, for example, reactive ion etching, plasma etching, ion beam etching or laser ablation.

Figure 3:
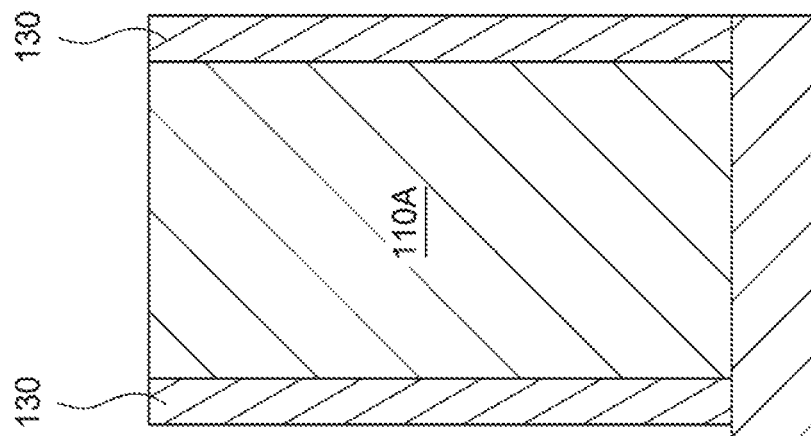
FIG. 3 shows a spacer material in accordance with an embodiment of the present specification.

Referring to FIG. 3, there is shown an embodiment according to the present specification that, optionally, uses a spacer 130 in contact with the semiconductor substrate 100 and the dislocation barrier layer 110A. The spacer 130 can be formed by deposition of a spacer material and then etching the deposited spacer material. The spacer material can be formed by a material that is different from the dislocation barrier layer 110A; however, in one embodiment of the present specification, the spacer 130 can be a dielectric oxide material and the dislocation barrier layer 110A (and the dielectric layer 110) is a silicon nitride material. In an example when the spacer is composed of silicon oxide ($SiO_2$), thermal oxidation can be used. Other examples of deposition processes that can be used in providing the spacer material, including scenarios where a nitride is used, include chemical vapor deposition (CVD), plasma enhanced chemical vapor deposition (PECVD), or atomic layer deposition (ALD). Examples of etching that can be used in providing the spacers include any etching process such as, for example, reactive ion etching. In one embodiment, the spacer 130 is composed of SiN.

Figure 4:
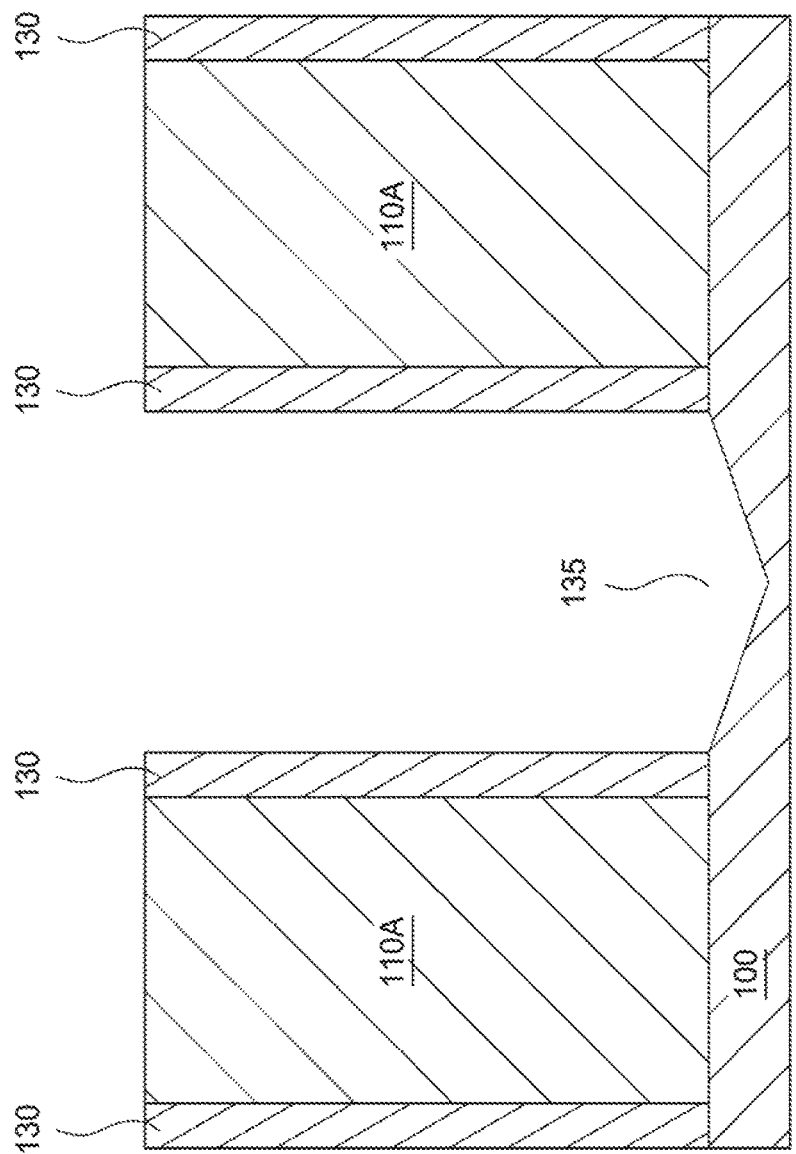
FIG. 4 shows development of an aspect-ratio trapping opening or trench in accordance with an embodiment of the present specification.
Figure 5:
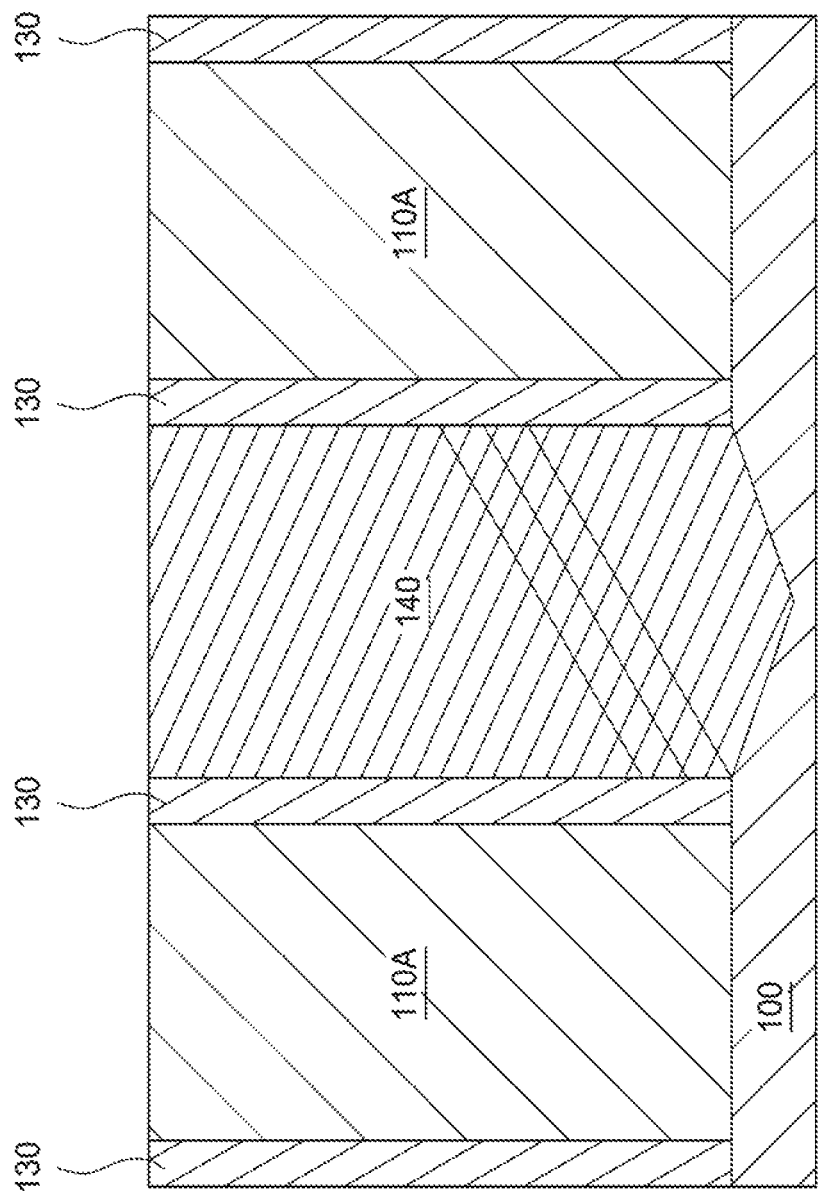
FIG. 5 shows deposition of a semiconductor material using an aspect-ratio trapping technique associated with an embodiment of the present specification.

Referring now to FIGS. 4 and 5, there is illustrated a view of a V-shaped (bound by 111-planes) opening or trench 135 at the bottom of semiconductor substrate 100, and selective epitaxial growth is used to form the semiconductor material 140 in the opening 135. Although a V-shaped opening at the bottom of the trench is shown, different orientations are possible in other embodiments. According to one embodiment of the Present Specification, the opening is developed by having the dislocation barrier layer 110A over the semiconductor substrate 100 and selectively etching to the (111) plane of the semiconductor substrate 100. In an embodiment of the Present Specification, the opening or trench width can be 150-300 nm and in an embodiment the aspect-ratio (width to depth) is 1:3. In other embodiments the trench width can be 1:10. The etching can be accomplished by applying a HCl-based chemistry prior to the epitaxial growth (in the instance when the substrate 100 an Si substrate) to the portion of the substrate 100 exposed at the bottom of the seed window, and in so doing, exposing (111) surfaces associated with the substrate 100. Thereafter, the opening 135 can be filled by depositing a semiconductor material over the substrate 100, where the semiconductor material can be lattice-mismatched in relation thereto. The epitaxial deposition can continue such that a heteroepitaxial region grows over the disposed material, and a lateral over-growth can occur. CMP can be applied discretely on small heteroepitaxial overgrowth regions that expand beyond the individual openings, or alternatively, if a larger area is preferable, the overgrowth can expand to coalesce with other regions and CMP can be applied to the larger structure. This is merely one particular practice of filling and developing an opening with aspect-ratio trapping techniques that are in accordance with the present specification, and those skilled in the art will appreciate that alternative methods can be applied both to develop and fill the opening 135, including techniques discussed in Lochtefeld.

In one embodiment of the present specification, the deposited semiconductor material 140 includes III-V semiconductor materials. Exemplary III-V semiconductor materials that can be used include but are not limited to gallium arsenide (GaAs), indium phosphide (InP) and indium gallium arsenide (InGaAs). Various processes are familiar to those of skilled in the art for growing III-V semiconductor materials on silicon substrates. Such processes include metalorganic chemical vapor deposition (MOCVD) and molecular beam epitaxy (MBE). Many different III-V compounds could be grown on the substrate 100 using multiple different precursors. Depending on which III-V material(s) is to be grown and which precursor is used, different parameters (temperature, process pressure, times, etc.) are applicable. Non-limiting examples of metalorganic prescursors include Trimethylgallium, Trimethylaluminum, Trimethylindium, Trimethylantimony, Tertiarybutylarsine and Tertiarybutylphosphine. Alternate Group V precursors include arsine and phosphine. In one embodiment, the deposited semiconductor material 140 is a composition that includes at least one of indium gallium arsenide (InGaAs) and indium-phosphide (InP). Depending on which Group V source is used, process temperature, gas flow, pressure and times can vary significantly in accordance with aspect-ratio trapping techniques know in the art or separately described herein.

Figure 6:
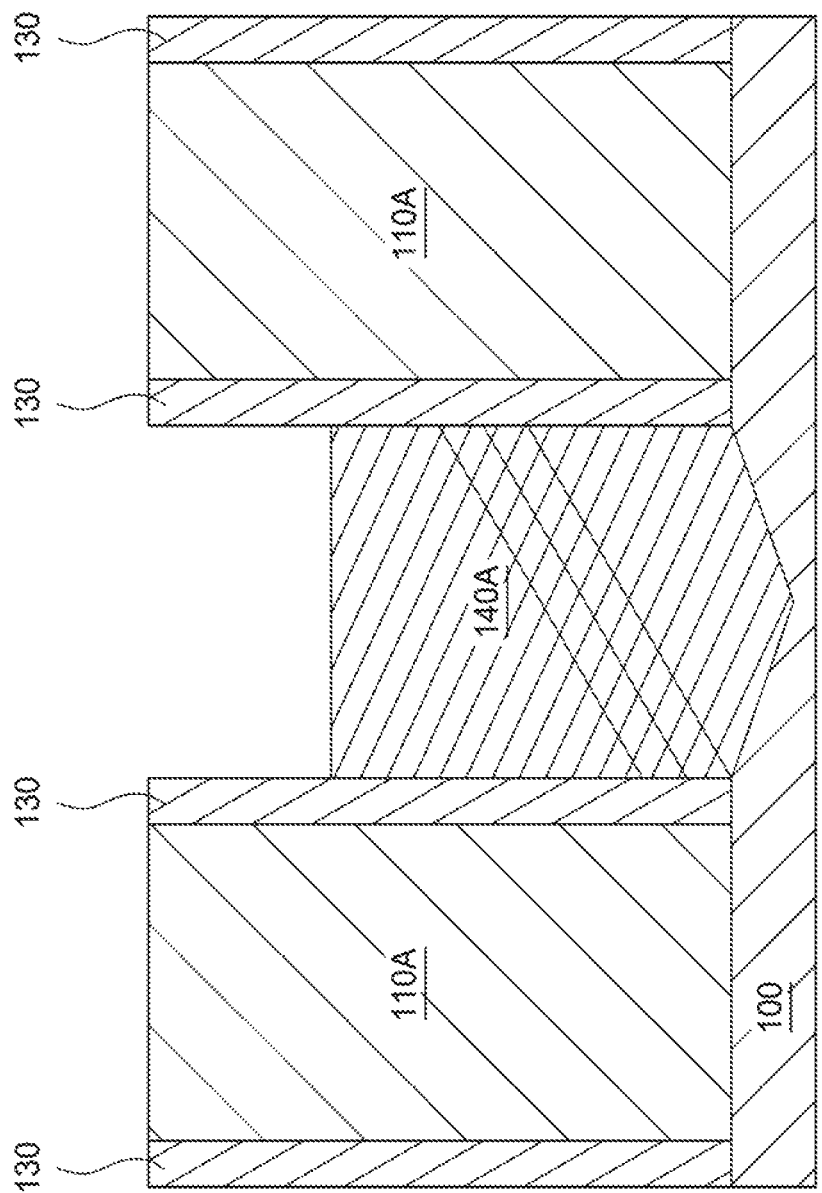
FIG. 6 shows recessing the deposited semiconductor material of FIG. 5 in accordance with an embodiment of the present specification.

FIG. 6 illustrates various views of the exemplary semiconductor structure of FIG. 5 after recessing the deposited semiconductor material 140. In one embodiment, the recessed semiconductor material portion 140A has a height that is less than the height of the original deposited semiconductor material portion 140, and 140A extends upwards from the semiconductor substrate 100. The recessed semiconductor material portion 140A is used as a growth surface during the subsequent formation of a semiconductor stack structure 155 that includes alternating channel layers 150 and layers 140A.

The deposited semiconductor material portion 140 can be recessed using an anisotropic etching process such as, for example, a reactive ion etching (RIE), that is selective in removing the semiconductor material that provides the original deposited material relative to the dislocation barrier layer 110A. In one embodiment, when the recessed semiconductor material portion 140A is composed of indium phosphate (InP), the recessing can be performed using a time etching sequence that employs RIE. In some embodiments (not shown), instead of forming and recessing the deposited semiconductor material layer 140, the epitaxial growth of the semiconductor material layer 140 can be controlled so the layer reaches a suitable height, and then stopped, thus disabling the need to perform a subsequent recess step. In one such embodiment, approximately ⅔ of the trench 135 is filled directly by controlled epitaxial growth, without recessing, to get to the resulting structure in FIG. 6.

Figure 7:
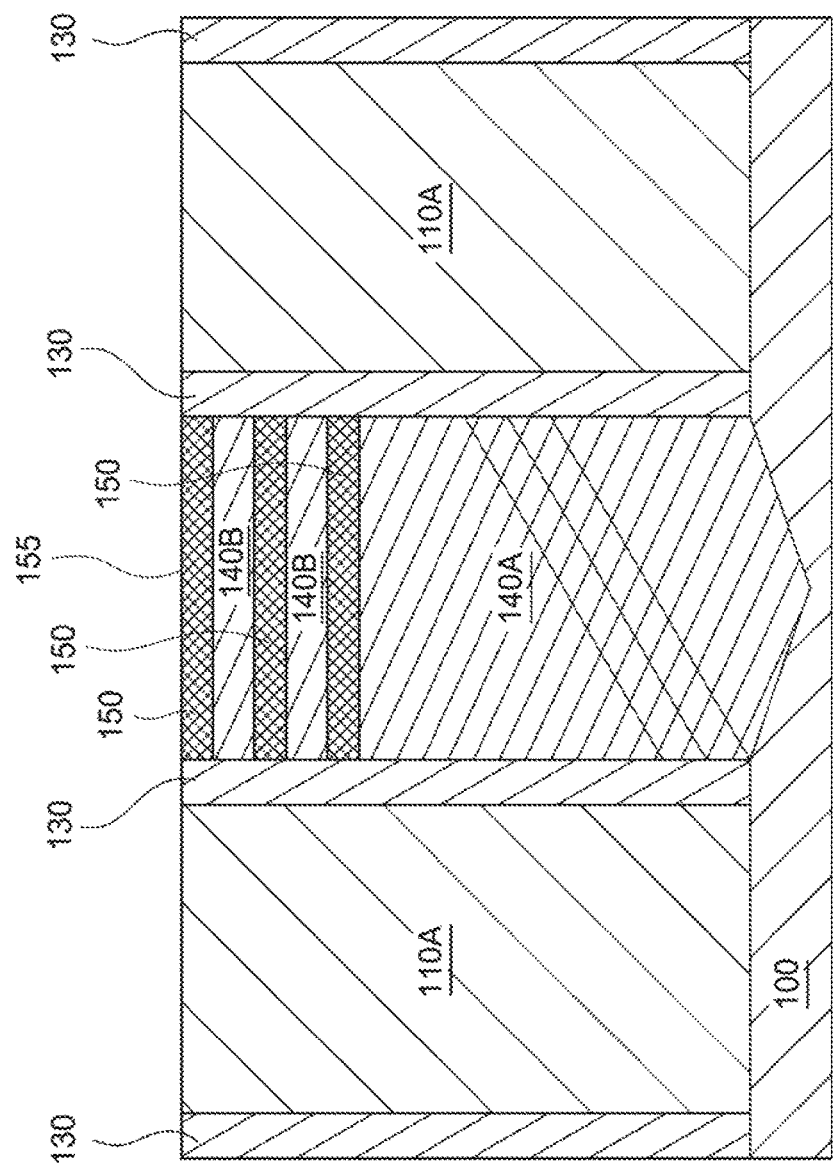
FIG. 7 shows growth of a semiconductor stack in accordance with an embodiment of the present specification.

FIG. 7 illustrates an exemplary semiconductor structure of FIG. 6 after forming a semiconductor stack structure 155 from an exposed surface of the recessed semiconductor material layer 140A. Each semiconductor stack structure 155 includes alternating layers of a sacrificial III-V compound semiconductor material 140B and a semiconductor channel material layer 150. In accordance with an embodiment of the present specification, each layer of semiconductor channel material layer 150 is sandwiched between a bottom layer of sacrificial III-V compound semiconductor material layer 140B and a top layer of sacrificial III-V compound semiconductor material layer 140B. In one embodiment, the semiconductor stack structure 155 includes at least two layers of semiconductor channel material (2n, wherein n is an integer of 1 or greater) and three layers of sacrificial III-V compound semiconductor material (2n+1).

In one embodiment, each layer of sacrificial III-V compound semiconductor material 140B is composed of one or more III-V materials, and is selected, along with the layer 150, so layer 150 and layer 140B are i) lattice matched and ii) selectively matched for etching. In another embodiment of the Present Specification, each layer of sacrificial III-V compound semiconductor material 140B can include a composition that includes indium phosphide (InP), and in one embodiment it is composed essentially of or consists of indium phosphide (InP).

In one embodiment, each layer of semiconductor channel material 150 includes a semiconductor material that is a III-V material, but differs from the III-V semiconductor material in the layers 140B, and is substantially lattice matched to the layers 140B that are contacting the channel material 150. By "substantially lattice matched" it is meant a semiconductor material that has a lattice constant that is from .+/−.5% from the lattice constant of the III-V compound semiconductor material that provides each layer of sacrificial III-V compound semiconductor material 140B. In some embodiments, each layer 150 includes one or more III-V materials, including but not limited indium gallium arsenide (InGaAs) or indium gallium antimonide (InGaSb).

Exemplary III-V semiconductor materials that can be used in the creation of the semiconductor material stack 155 include, but are not limited to, gallium arsenide (GaAs), indium phosphide (InP), gallium arsenide (GaAs) and indium gallium arsenide (InGaAs). In certain embodiments, Indium phosphide (InP) and indium gallium arsenide (InGaAs) can be used as the alternating layers. In one particular embodiment, $In_{0.53}Ga_{0.47}As$ can be used as a material for one of the two layers, i.e. layer 150. The lattice constants of $In_{0.53}Ga_{0.47}As$ and InP are the same, allowing a high quality InGaAs layer to be grown on InP. As such, in one embodiment, layer 140B will be InP and layer 150 will be $In_{0.53}Ga_{0.47}As$. These materials are lattice matched and selective to one another for etching, which will allow 140B to operate as a sacrificial layer that allows InGaAs channels to 150 develop pursuant to the techniques discussed below and in accordance with at least one embodiment of the present specification. It should be noted, that according to one embodiment (not shown), each individual stack 155 in the device can be composed of different III-V materials, i.e., in one region, the layer 150 can be a different III-V material of a stack 155 than the layer 150 of another stack 155 in a different region. This, in conjunction with doping, can allow for different device functionality, i.e. one region being an n-FET and the other a p-FET.

Various processes are familiar to those of skilled in the art for growing III-V semiconductor materials, some of which have been described above. Such processes include metalorganic chemical vapor deposition (MOCVD) and molecular beam epitaxy (MBE). Many different III-V compounds could be grown on the substrate 100 and accordingly multiple precursors could be used. Depending on which III-V material(s) is to be grown and which precursor is used, different parameters (temperature, process pressure, times, etc.) are applicable. Metal-organic precursors include Trimethylgallium, Trimethylaluminum, Trimethylindium, Trimethylantimony, Tertiarybutylarsine and Tertiarybutylphosphine. Alternate Group V precursors include arsine and phosphine. The source gas may include at least two precursor gases, one for the type III material and one for the type V material, and a carrier gas, such as, for example hydrogen. The at least two precursor gases used for providing each layer of sacrificial III-V compound semiconductor material 140B can differ from the at least one source gas used for providing each layer of semiconductor channel material 150. The growth temperature in the chamber may range from 250 degrees Celsius to 900 degrees Celsius. The growth system also may utilize low-energy plasma to enhance the layer growth kinetics. The epitaxial growth system may be a single-wafer or multiple-wafer batch reactor. As discussed above, depending which source gas is used, process temperature, gas flow, pressure and times can vary significantly.

Each layer 140B of sacrificial III-V compound semiconductor material of the semiconductor stack structure 155 may have the same or greater vertical thickness that is greater than a vertical thickness of each layer 150 of channel semiconductor material. In one embodiment, the vertical thickness of each layer 140B can be from 5 nm to 20 nm. In one embodiment, 140B can have a vertical thickness can be from 5-20 nm, and in another embodiment the vertical thickness can be from 8-12 nm; and for layer 150, the vertical thickness can be 5-20 nm, and in another embodiment the vertical thickness can be 6-10 nm.

Figure 8:
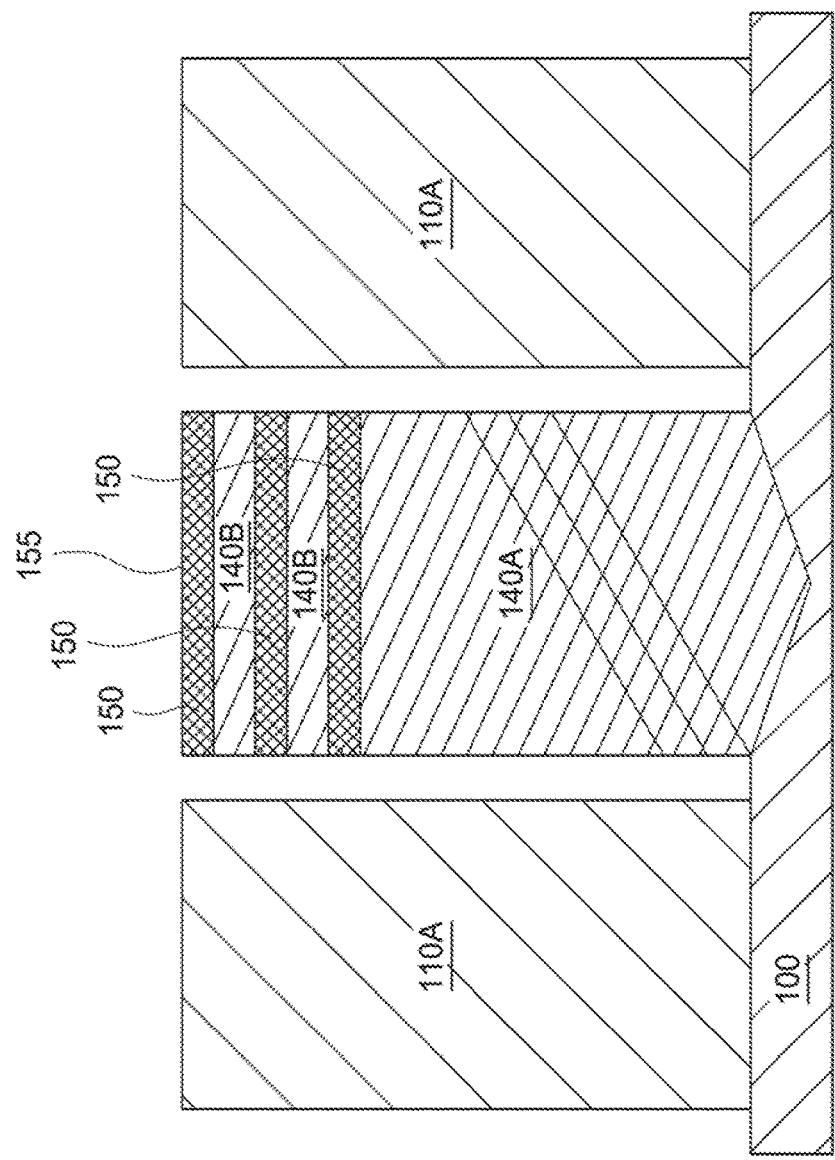
FIG. 8 shows removal of the spacer in accordance with an embodiment of the present specification.
Figure 9:
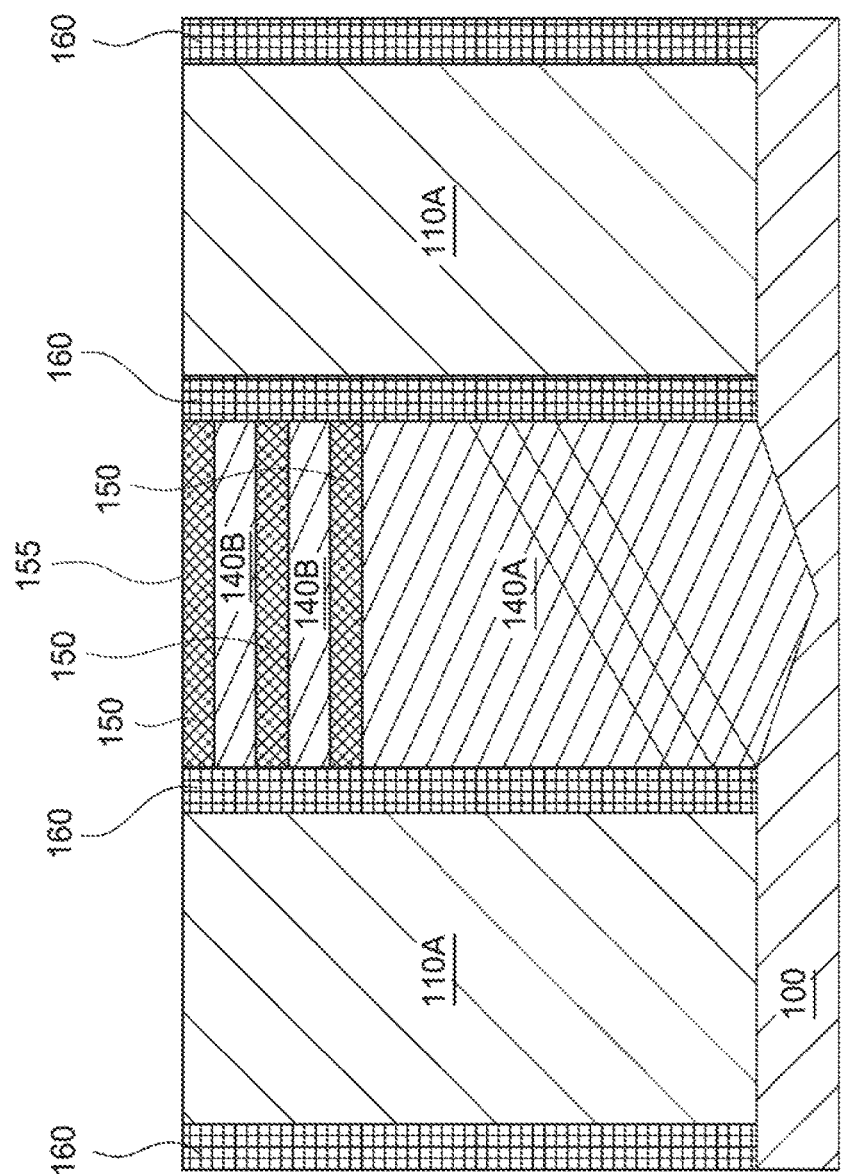
FIG. 9 shows development of a PTS in accordance with an embodiment of the present specification.

FIGS. 8 and 9 illustrate removing the spacer 130 and subsequently epitaxially growing a III-V material, which after doping (described below), will act as a punch-through stop layer (semi-isolating) or PTS layer 160. The spacer 130 can be removed using any conventional selective etch process, depending on the composition of the spacer 130 and in relation to the other layers contacting the spacer 130. For example, if the spacer 130 constitutes an oxide material, it can be removed by selective application of hydrofluoric acid or chemical oxide removal. The semiconductor III-V material that will constitute the PTS layer 160 can be formed utilizing an epitaxial growth from the layers 140A, 140B, 150 followed by a planarizing step, such as CMP. Examples of various suitable epitaxial growth processes that are suitable for use in forming the semiconductor PTS layer 160 include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD), molecular beam epitaxy (MBE) or metal-organic CVD (MOCVD). The temperature for epitaxial deposition typically ranges from 250° C. to 700° C. In one embodiment, at least two PTS layers 160, e.g. supporting structure 155', can be considered twin-vertical PTS layer structure, e.g. at least two twin-vertical PTS layers 160, connected to the substrate 100.

A number of different source gases may be used for the deposition of the material that provides the semiconductor PTS layer 160. Carrier gases like hydrogen, nitrogen, helium and argon can also be used. The precursor gases and techniques discussed above, such as when III-V semiconductor materials such as gallium arsenide (GaAs), indium phosphide (InP) and indium gallium arsenide (InGaAs) are desired, the deposition techniques discussed above, including selecting at least two precursor gases as described above, can be applied to develop the PTS layer in accordance with the purpose described herein.

In an embodiment, the PTS layer 160 is heavily doped, forming doped PTS layer 170, and may include an n-type dopant or a p-type dopant. If an n-FET type structure is preferred, then the PTS layer 160 must be doped to an opposite type of an n-FET type layer 150, i.e. "p-type," and visa-versa, if a p-FET type is preferred, then the PTS layer 160 must be doped to an opposite type of the p-FET type layer 150, i.e. "n-type." For example, if an n-FET structure employs a suitable material, such as, by way of non-limiting example, InGaAs, for layer 150, then the PTS layer 160 would be doped to a p-type; and in the case where a p-FET structure is employed, i.e. layers 150, by way of non-limiting example, are composed of a suitable material such as InGaSb layers 150, then the PTS layer 160 will be n-doped. The term "n-type" denotes an impurity (e.g., dopant) that when added to an intrinsic semiconductor material contributes free electrons to the intrinsic semiconductor material. The term "p-type" denotes an impurity (e.g., dopant) that when added to an intrinsic semiconductor material creates deficiencies of free electrons in the intrinsic semiconductor material. For a III-V PTS layer 160, where a p-type dopant is preferred, Group II materials, such as magnesium and zinc can be employed. For a III-V PTS layer 160, where an n-type dopant is preferred, tellurium or selenium can be employed. Both of the examples given for the n-type and p-type cases are non-limiting, and other suitable dopants can be used, depending on the material selection of the relevant layers employed for a given structure. The concentration of an n-type dopant or a p-type dopant that is present in the semiconductor PTS layer 160 can be, typically from $1\times10^{18}$ atoms/cm$^3$ to $1\times10^{19}$ atoms/cm$^3$. In one embodiment, the semiconductor PTS layer 160 can have a thickness from 10 nm to 30 nm, however other thicknesses that are lesser than, or greater than, the aforementioned thickness range may also be employed as thickness of the semiconductor PTS layer 160. Finally, in one embodiment the layer 150 and layer 160 will have substantially similar lattice constants, and in one embodiment they will be of the same type of III-V material, except that the layer 160 will be of the opposite n/p type in relation to layer 150 because of the doping.

In one embodiment, the doped PTS layer 170 is formed within an upper portion of the semiconductor substrate 100 by introducing n-type or p-type dopants within the upper portion of the semiconductor substrate 100. The dopant can be added at various times during the fabrication process, including after deposition of the PTS layer 160. In one embodiment, as suggested, the PTS layer 160 is in-situ doped during the epitaxial growth, such that the doped PTS layer 170 is formed with the dopant therein. Various examples of various epitaxial growth processes have been mentioned above.

Figure 10:
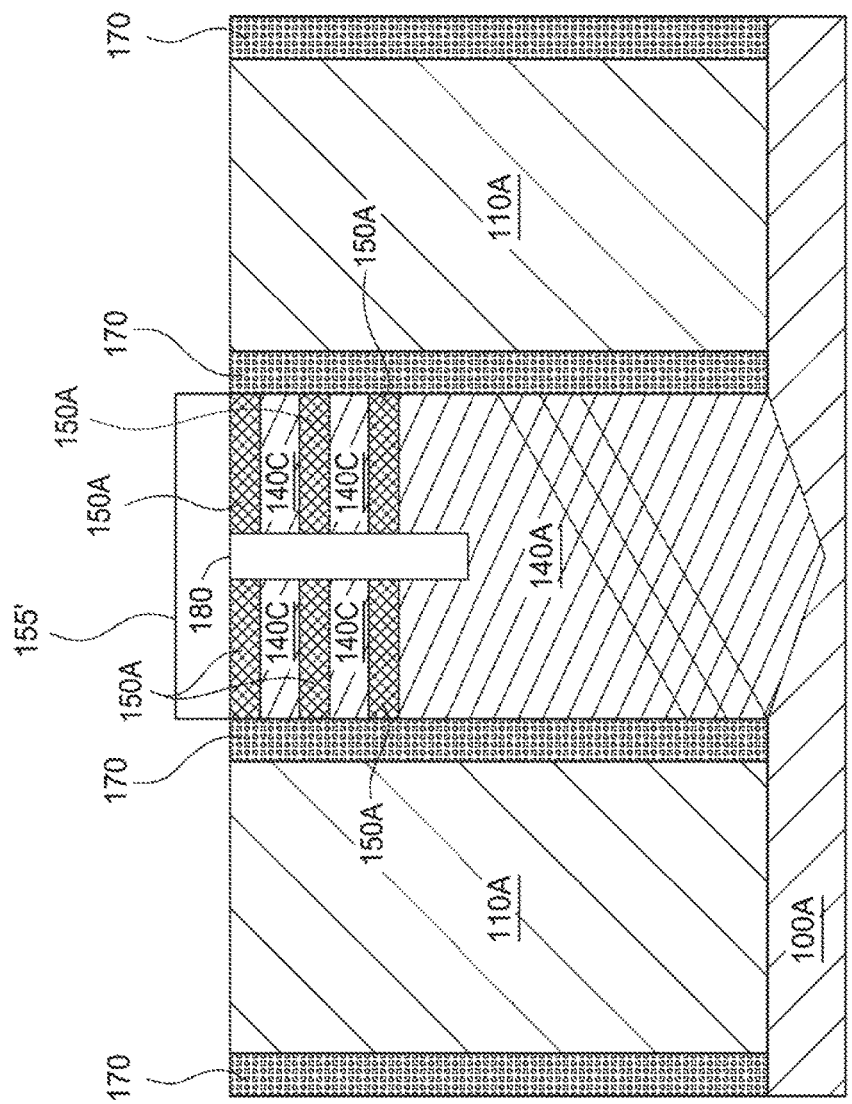
FIGS. 10 and 11 show recess and/or etching steps of in accordance with at least one embodiment of the present specification.

FIG. 10 illustrates etching the semiconductor stack 155. An opening 180 is made through the sacrificial layers 140B and the channel layers 150 using one of or both etching and lithography. Lithography includes forming a photoresist material (not shown) atop a material or material stack to be patterned, where the process can include utilizing at least one pattern transfer etching process. Typically, the at least one pattern transfer etching process is an anisotropic etch. In one embodiment of the present specification, a dry etching process such as, for example, reactive ion etching can be used. In another embodiment of the present specification, a chemical etchant can be used. In still a further embodiment, a combination of dry etching and wet etching can be used. In the illustrated embodiment, the etch stops within a portion of the recessed III-V semiconductor layer 140A.

For purposes of discussing the next embodiment of the present specification, the resulting etched semiconductor structure 155' will be referred to as a nanosheet semiconductor structure 155'. Each semiconductor nanosheet structure includes a remaining portion of each the sacrificial III-V compound semiconductor material layers 140B and a remaining portion of the semiconductor channel layers 150.

Each remaining portion of each layer 140B of sacrificial III-V compound semiconductor material is referred to herein as a sacrificial nanosheet of sacrificial III-V compound semiconductor material layer 140C, while each remaining portion of each layer of semiconductor channel material 150 is referred to herein as a nanosheet of semiconductor channel material layer 150A.

Figure 11:
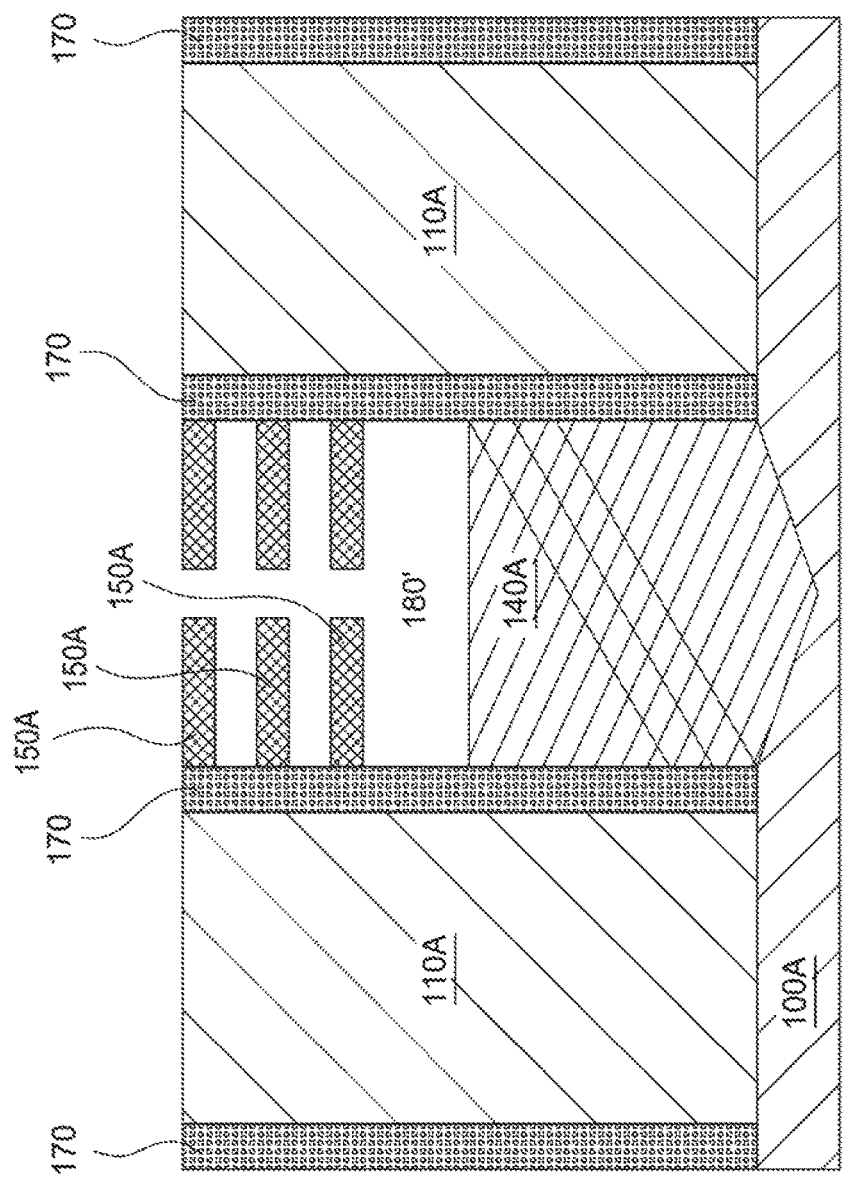

FIG. 11 illustrates the exemplary semiconductor structure of FIG. 10 after removing each remaining portion of the sacrificial III-V nanosheet semiconductor material layer 140C to provide suspended and stacked nanosheets 150A from the semiconductor channel layers 150, and creating the opening 180'. Since the materials were chosen in a manner that a selective etch can be performed, the removal of each remaining portion of the sacrificial III-V compound semiconductor layers 140C of the semiconductor nanosheet structure 155' can be performed utilizing a wet etch process that is selective in removing a III-V compound semiconductor material in the layers 140A and 140C relative to a semiconductor channel material in layers 150A, such as selective application of HCl or equivalent. With the removal of the sacrificial III-V nanosheet layers 140C, the suspended and stacked nanosheets 150A are supported by the PTS layers 170.

According to one embodiment, the width of each sacrificial nanosheet of sacrificial III-V compound semiconductor material 140C and the width of each nanosheet of semiconductor channel material 150A can be from 15 nm to 60 nm. In other embodiments, different dimensions in accordance with the techniques discussed herein are possible.

In one embodiment, as shown in FIG. 11, the a portion of the plurality of nanosheets 150A extends horizontally from one or more of the PTS layers 170 towards another one of the PTS layers 170, where there is an opening 180' separating one set of nanosheets 150A from the other set of nanosheets 150A. In one embodiment, one or more nanosheets 150A are parallel in relation to layer 140A and perpendicular in relation to the PTS layers 170 and/or the dislocation blocking layers 110A.

Figure 12:
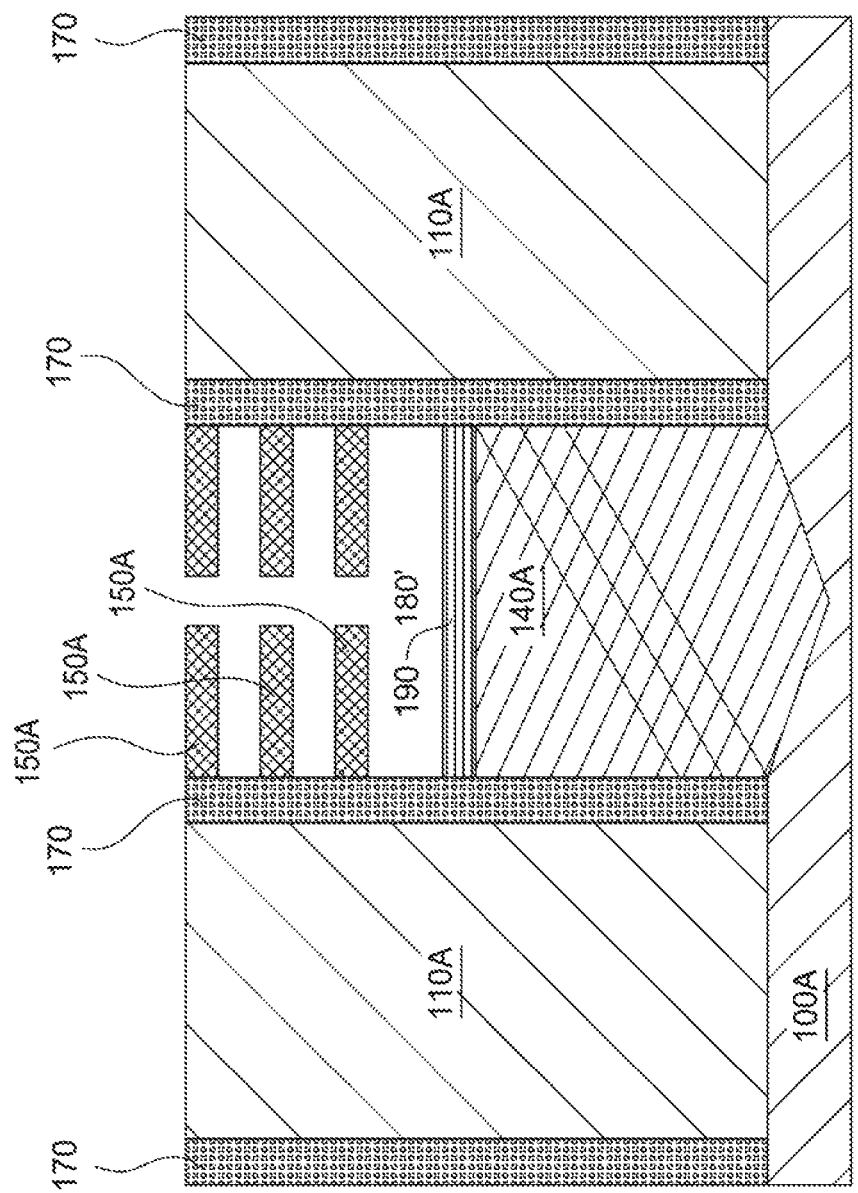
FIG. 12 shows development of residual oxide material on a device in accordance with an embodiment of the present specification.

FIG. 12 illustrates the structure of FIG. 11 after depositing, recessing and removing of, a flowable oxide insulator layer (not shown). The flowable oxide layer can flow over the entire structure shown in FIG. 12, and flow through the opening 180' created by the lithography and etching steps described in reference to FIG. 10 and the spaces created by removing the sacrificial III-V compound semiconductor layers 140C. The flowable oxide, e.g. hydrogen silsesquioxane (HSQ) or any other suitable flowable oxide, layer may be formed over the device using any horizontal filling deposition technique known in the art, such as, for example, spin deposition of a liquid material while spinning the wafer at high RPM's, followed by a curing period and annealing at roughly 500-900° C., where a preferred embodiment of the present specification would anneal at 600° C. Deposition of the flowable oxide provides the benefit of later device isolation for the channels of FIG. 12. The flowable oxide is subsequently recessed using any etching technique known in the art, such as, for example, a wet etch process that applies HF; however, in accordance with a preferred embodiment of the present specification, residual oxide material 190 remains over recessed semiconductor material layer 140A, where the residual oxide material 190 will isolate layer 140A from adverse physical effects that can be introduced by additional fabrication steps in developing the final device structure. For example, parasitic capacitance and resistance can occur over the recessed semiconductor material layer 140A as additional layers are added there-over or in contact therewith, e.g. when a gate layer (not shown) is fabricated over the recessed semiconductor material layer 140A, where the residual oxide material 190 will mitigate those adverse physical effects by insulating the material layer 140A from the gate.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A structure comprising:
   a substrate;
   at least two twin vertical punch-through stop layer (PTS) layers connected to the substrate; and
   a plurality of nanosheets connected to and supported by the twin vertical PTS layers.

2. The structure according to claim 1 further comprising:
   a III-V semiconductor material layer disposed on the substrate and in contact with the at least two twin PTS layers, wherein the III-V semiconductor layer is parallel to the plurality of nanosheets.

3. The structure according to claim 2 further comprising:
   a dislocation barrier layer disposed on the substrate and in contact with the at least two twin PTS layers, wherein the dislocation barrier layer is perpendicular in relation to the plurality of nanosheets.

4. The structure according to claim 1, wherein a dopant of the at least two twin PTS layers is a p-type dopant.

5. The structure according to claim 4, wherein the p-type dopant comprises at least one of i) Mg and ii) Zn.

6. The structure according to claim 2 further comprising:
   a residual oxide layer over the III-V semiconductor material layer and in contact with the at least two twin PTS layers.

7. The structure according to claim 2, wherein the substrate and the III-V semiconductor material layer form a 111 interface suitable for aspect-ratio trapping.

8. The structure according to claim 2, wherein the at least two twin PTS layers, the III-V semiconductor material layer, and the plurality of nanosheets include material selected from the group including i) gallium arsenide (GaAs), ii) indium phosphide (InP) and iii) indium gallium arsenide (InGaAs).

9. The structure according to claim 2, wherein the at least two twin PTS layers and the plurality of nanosheets both consist the same material, and wherein the III-V semiconductor material layer consists of different material from both the at least two twin PTS layers and the plurality of nanosheets.

10. The structure according to claim 2, wherein the at least two twin PTS layers and the plurality of nanosheets both include indium gallium arsenide (InGaAs), wherein the III-V semiconductor material layer includes indium phosphide (InP), and wherein the dislocation barrier layer includes silicon nitride.

11. A method for forming a semiconductor device comprising:
   providing a semiconductor substrate;
   providing a dielectric material layer suitable as a dislocation blocking mask in an aspect-ratio trapping process on the semiconductor substrate;

forming an aspect-ratio trapping trench on the semiconductor substrate;

epitaxially growing and planarizing a plurality of PTS layers over the semiconductor substrate; and developing a plurality of nanosheets from the aspect-ratio trapping trench, wherein the plurality of nanosheets contact and are supported by the PTS layers.

12. The method according to claim 11 further comprising:
prior to depositing the plurality of PTS layers, depositing a spacer over the semiconductor substrate and in contact with the dielectric material.

13. The method according to claim 12, wherein developing the plurality of nanosheets comprises:

filling the aspect-ratio trapping trench on the semiconductor substrate with III-V semiconductor material, wherein a portion of the aspect-ratio trapping trench of the semiconductor substrate and a portion of the III-V semiconductor material form a 111 interface at a point of contact;

recessing the III-V semiconductor material;

growing a semiconductor material stack over the recessed III-V semiconductor material, wherein the semiconductor material stack comprises i) a plurality of channel layers that alternate with ii) a plurality of sacrificial layers;

removing the spacer;

etching through the semiconductor material stack and recessed III-V semiconductor material;

selectively removing the plurality of sacrificial layers;

depositing flowable oxide over the semiconductor device and into an opening created by the etching and selective removal steps; and recessing the flowable oxide such that a substantial portion of deposited oxide is removed from the plurality of channels and a residue amount of oxide remains over the recessed III-V semiconductor material.

14. The method according to claim 13 further comprising:
doping the plurality of PTS layers with a p-type dopant.

15. The method according to claim 14, wherein the p-type dopant comprises at least one of i) Zn and ii) Mg.

16. The method according to claim 13, wherein the plurality of PTS layers, the III-V semiconductor material layer, and the plurality of nanosheets include material selected from the group consisting of i) gallium arsenide (GaAs), ii) indium phosphide (InP) and iii) indium gallium arsenide (InGaAs).

17. The method according to claim 13, wherein the plurality of PTS layers and the plurality of nanosheets both consist of the same material, and wherein the III-V semiconductor material layer consists of different material from both the PTS layer and the plurality of nanosheets.

18. The method according to claim 13, wherein the PTS layers and the plurality of nanosheets both include gallium arsenide (InGaAs), and wherein the III-V semiconductor material layer includes indium phosphide (InP).

19. The method according to claim 18, wherein the dielectric layer consists essentially of silicon nitride and the spacer consists essentially of an oxide material.

20. A structure comprising:
a substrate;
at least two twin vertical punch-through stop layer (PTS) layers connected to the substrate; and
a plurality of nanosheets connected to and supported by the twin vertical PTS layers, wherein a first portion of the plurality of nanosheets extend horizontally from one of the at least two twin vertical PTS layers towards another one of the at least two twin vertical PTS layers, wherein a second portion of the plurality of PTS layers extends horizontally from the another one of the at least two twin vertical punch layer towards the one of the at least two twin vertical PTS layers, and wherein a gap separates the first and second portions of the plurality of nanosheets.

* * * * *